United States Patent
Kohama et al.

(10) Patent No.: US 6,921,589 B2
(45) Date of Patent: Jul. 26, 2005

(54) ELECTROLUMINESCENT ELEMENTS

(75) Inventors: Akira Kohama, Otsu (JP); Tsuyoshi Tominaga, Otsu (JP); Daisuke Kitazawa, Otsu (JP); Yoshio Himeshima, Kawasaki (JP)

(73) Assignee: Toray Industries, Inc., Tokyo (JP)

( * ) Notice: Subject to any disclaimer, the term of this patent is extended or adjusted under 35 U.S.C. 154(b) by 48 days.

(21) Appl. No.: 10/173,446

(22) Filed: Jun. 18, 2002

(65) Prior Publication Data

US 2002/0160227 A1 Oct. 31, 2002

Related U.S. Application Data

(63) Continuation of application No. 09/432,066, filed on Nov. 2, 1999, now abandoned.

(30) Foreign Application Priority Data

Nov. 9, 1998 (JP) .......................................... 10-317681
Jul. 2, 1999 (JP) .......................................... 11-188766

(51) Int. Cl.$^7$ ............................................. H05B 33/14
(52) U.S. Cl. ...................... 428/690; 428/917; 313/504; 313/506; 257/88; 257/102; 257/103
(58) Field of Search ................. 428/690, 704, 428/917; 313/500, 504, 506; 257/88, 102, 103

(56) References Cited

U.S. PATENT DOCUMENTS

| 4,769,292 | A |   | 9/1988  | Tang et al. ............... 428/690 |
| 6,229,505 | B1 |  | 5/2001  | Fujii ........................ 345/76 |
| 6,805,978 | B2 | * | 10/2004 | Murase et al. ........... 428/690 |
| 2003/0082406 | A1 | * | 5/2003 | Murase et al. ........... 428/690 |

FOREIGN PATENT DOCUMENTS

| EP | 0 786 925 A2 | 7/1997 |
| JP | 09-118880 | 5/1997 |
| JP | 09-289081 | 11/1997 |
| JP | 11-97180 | 4/1999 |
| JP | 11-176572 | 7/1999 |

* cited by examiner

*Primary Examiner*—Marie Yamnitzky
(74) *Attorney, Agent, or Firm*—Morrison & Foerster LLP

(57) ABSTRACT

The present invention relates to an electroluminescent element formed by placing a luminescing substance between an anode and a cathode, such that when electrical energy is applied to the element, light is emitted having a peak wavelength of at least 580 nm. The luminescing substance comprises a fluorescent compound have a fluorescent maximum at about 540 nm or above and a compound having a pyrromethene structure (I) or metal complexes thereof.

10 Claims, No Drawings

ELECTROLUMINESCENT ELEMENTS

This application is a continuation of U.S. Ser. application No. 09/432,066, filed Nov. 2, 1999, now abandoned, which is hereby incorporated by reference.

BACKGROUND TO THE INVENTION

The present invention relates to electroluminescent elements which are elements which can convert electrical energy into light and which can be employed in fields such as display devices, flat panel displays, back lights, illumination, interiors, markers, signs, electronic cameras, optical signal generators and the like.

Research into organic thin film electroluminescent elements, which emit light when the electrons injected from the cathode and the holes injected from the anode recombine within an organic fluorescent substance interposed between two electrodes, has been actively pursued in recent years. Such elements are receiving considerable attention in that they are of a thin shape, emit light of high luminance under low driving voltages, and provide light emissions of many colours depending on the particular fluorescent material selected. Since the disclosure by C. W. Tang et al of the Eastman Kodak Co. that organic thin film electroluminescent elements emit light of high luminance (Appl. Phys. Lett. 51 (12) 21, p.913, 1987), such research has been carried out by many research bodies. In the typical structure of organic thin layer electroluminescent element presented by the Eastman Kodak Co. research group, there are provided in turn, on an ITO glass substrate, a hole transporting diamine compound, tris(8-quinolinolato) aluminium complex as the light emitting layer, and Mg:Ag as the cathode, and green coloured light emission of 1000 cd/m² is possible at a driving voltage of about 10 V. At present, some organic thin film electroluminescent elements differ in structure in that, as well as the aforesaid structural components of the element, an electron transporting layer is also provided, but basically the Eastman Kodak Co. structure is still followed.

Amongst the many colours of light emission, research into red coloured light emission as a useful light emission colour is well advanced. Known red coloured luminescent materials include those of the perylene derivatives such as bis(diisopropylphenyl)perylene, the perynone derivatives, the porphyrin derivatives and Eu complexes (Chem. Lett., 1267 (1991)).

Again, as a means for obtaining red light emission, methods have also been investigated for mixing a minute amount of a red fluorescent material in the host material, as a dopant material. Examples of the host material are tris(8-quinolinolato)aluminium complex, bis(10-benzoquinolinolato)beryllium complex, diarylbutadiene derivatives, stilbene derivatives, benzoxazole derivatives, benzothiazole derivatives and the like, and by having present therein, as a dopant material, 4-(dicyanomethylene)-2-methyl-6-(p-dimethylaminostyryl)-4H-pyran, a metal phthalocyanine derivative (MgPc, AlPcCl or the like), a squarilium derivative or a violanthrone derivative, red luminescence is obtained.

However, in the case of the conventional red coloured luminescent materials (host material and dopant material), even where the peak emission wavelength exceeds 580 nm the peak width is broad, so the colour purity has been poor and it has not been possible to obtain a beautiful red coloured luminescence. Moreover, while the rare earth complexes such as Eu complexes have a narrow peak emission width and a beautiful red coloured luminescence is obtained, their maximum luminance is low, ranging from a few to a few tens of cd/m², so there has been the problem that clear display is not possible.

The present invention has the objective of resolving such problems and offering red electroluminescent elements of high colour purity.

ESSENCE OF THE INVENTION

The present invention comprises electroluminescent elements wherein a substance which brings about luminescence is present between an anode and cathode, the electroluminescent elements emit light of peak wavelength at least 580 nm by means of electrical energy, and said substance which brings about luminescence includes at least a fluorescent compound of fluorescence maximum at least 540 nm and a compound with a pyrromethene structure or metal complex thereof.

PREFERRED EMBODIMENTS

The anode in the present invention should be a transparent electroconductive material to allow transmission of light. The anode material can be tin oxide, indium oxide (ITO) or other such electroconductive metal oxide, or a metal such as gold, silver, chromium, an inorganic electroconductive substance such as copper iodide or copper sulfide, or an electroconductive polymer such as polythiophene, polypyrrole, or polyaniline. Of these, the use of ITO glass or Nesa glass is especially preferred. The resistance of the transparent electrode should be such that sufficient current can be supplied to bring about luminescence by the element. For example, an ITO substrate of no more than 300 Ω/□ will function as an element electrode. However, from the point of view of the power consumption of the element, a low resistance is preferred. Currently, substrates of around a resistance of 10 Ω/□ are commercially available. The thickness of the ITO can be freely selected in accordance with the resistance value but, normally, there is most often employed a value in the range 100 to 300 nm. Again, with regard to the glass substrate, there may be used soda-lime glass or an alkali-free glass, etc. and the thickness should be a value sufficient to secure mechanical strength. Providing the thickness is at least 0.5 mm, this will suffice. There should be little elution of ions from the glass, so an alkali-free glass is preferred but, soda-lime glass which has been barrier-coated with $SiO_2$ or the like can also be used. The ITO film formation method is not particularly restricted and there can be employed the electron beam method, sputtering method, chemical reaction method or the like.

The cathode should be a material which can inject electrons efficiently into the organic layer. Examples of the cathode Material are platinum, gold, silver, copper, iron, tin, zinc, aluminium, indium, chromium, lithium, sodium, potassium, calcium, magnesium and the like, but for raising the electron injection efficiency and enhancing the characteristics of the element, lithium, sodium, potassium, calcium, magnesium or other such low work function metal or alloy thereof is effective. However, generally speaking, these low work function metals are often unstable in air, so for example the method of using a highly stable electrode and doping the organic layer with a minute amount of lithium or magnesium (no more than 1 nm according to a vacuum-deposited film thickness meter) can be given as a preferred example. Again, it is also possible to use an inorganic salt such as lithium fluoride. Furthermore, for electrode protection, lamination with a metal such as platinum, gold, silver, copper, iron, tin, aluminium or indium, or alloy thereof, or an inorganic material such as silica, titania or silicon nitride, or polyvinyl alcohol, or vinyl chloride or hydrocarbon type polymer, etc, can be given as a preferred example. Moreover, the method of constructing such electrodes is not particularly restricted and there can be used resistance heating, an electron beam, sputtering, ion plating, coating or the like.

The substance which brings about luminescence in the present invention is a layer containing the luminescent material by itself or the luminescent material and a hole transporting material and/or electron transporting material. In the case where it includes luminescent material and hole transporting material and/or electron transporting material, these substances may be mixed to form a single layer, or they may have a multilayer laminate structure such as 1) hole transporting layer/luminescent layer, 2) hole transporting layer/luminescent layer/electron transporting layer, or 3) luminescent layer/electron transporting layer.

The hole transporting layer is a layer containing a hole transporting material. It may also be a laminate or a mixture of two or more hole transporting materials. As the hole transporting material, there can be used a compound which forms the thin film required in element fabrication, into which can be injected holes from the anode, and which can also transport the holes. Preferred examples of the hole transporting material are N,N'-diphenyl-N,N'-di(3-methylphenyl)-4,4'-diphenyl-1,1'-diamine, N,N'-dinaphthyl-N,N'-diphenyl-4,4'-diphenyl-1,1'-diamine and other such triphenylamines, bis(N-allylcarbazole) or bis(N-alkylcarbazole), pyrazoline derivatives, stilbene derivatives, hydrazone derivatives, oxadiazole derivatives, heterocyclic compounds typified by phthalocyanine derivatives and porphyrin derivatives, and polycarbonate, polystyrene, polyvinyl carbazole, polysilane or other such polymers with an aforesaid compound in the side chains.

The luminescent material of the present invention emits light of peak wavelength 580 nm or above by means of electrical energy. At below 580 nm, even where the peak width is narrow, it is not possible to obtain red luminescence of good colour purity. In order to achieve a beautiful red display, the peak wavelength in the emission spectrum will preferably lie within the range 580 nm to 720 nm, with the range 600 nm to 700 nm further preferred. At above 720 nm, the luminosity becomes poor, so the high luminance red light emission efficiency becomes poor. Again, in order to achieve a beautiful red display, it is preferred that the FWHM (full width at half maximum) of the peak wavelength in the emission spectrum be no more than 100 nm. It is preferred that the emission spectrum has a single peak as far as possible but, depending on the circumstances, it may have a number of maxima due to the superposition of other peaks or a shoulder may appear at the edge of a peak. In the present invention, the peak wavelength is the wavelength of the maximum peak, and the FWHM is the peak width at half the height of the maximum peak.

Electrical energy denotes primarily direct current but it is also possible to use pulse or alternating current. The current value and the value of the voltage are not particularly restricted but, taking into account the power consumption and life of the element, these should be such that maximum luminance is obtained at as low energy as possible.

Now, the luminescent material of the present invention contains a fluorescent compound of fluorescence maximum in the range 540 nm to 720 nm, and a compound with pyrromethene structure (also referred to as a diazaindacene structure) or metal complex thereof. In the present invention said fluorescent compound acts as the host material and the compound with a pyrromethene structure, or metal complex thereof, acts as the dopant material. In such circumstances, the dopant material may be included throughout the host material or it may be included in parts. The dopant material may also be laminated to the host material or dispersed in the host material.

For energy transfer from the host material to the dopant material, it is necessary that the fluorescence spectrum of the host material and the absorption spectrum (the excitation spectrum) of the dopant material overlap. Again, the Stokes shift (the difference between the excitation spectrum peak and the fluorescence spectrum peak) of a dopant material of good colour purity is narrow, being in the range from a few to a few tens of nm, and in order to obtain red light emission of good colour purity at 580 nm or above, it is necessary for the absorption spectrum (excitation spectrum) of the dopant material to be at least 540 nm. Moreover, in order to obtain a high luminance high colour purity red light emission between 580 nm and 720 nm, then it is preferred that the absorption spectrum of the dopant material be in the range 540 nm to 720 nm (yellow, yellow-orange, orange, red-orange or red region). If the fluorescence spectrum of the host material lies on the shorter wavelength side from yellow, namely in the yellow-green, green, blue-green, blue, blue-violet or violet regions, then there is little overlap of the spectra and energy transfer does not take place rapidly. No light emission is obtained from the dopant material or, where it is obtained, light emission from the host material remains, causing whitening or the like, so red light emission of high colour purity is not obtained. In Japanese Unexamined (Kokai) Patent Publication No. 9-208946 there is described an example where a blue luminescent material is used as the host material and a compound with a pyrromethene structure (diazaindacene derivative) is used as the dopant material. However, there is little spectral overlap and insufficient energy transfer takes place, so blue light emission from the host material is mixed with the light emission from the dopant material, and only a white light emission is obtained. In Japanese Unexamined (Kokai) Patent Publication No. 9-118880 there is described an example where a green luminescent material is used as the host material and a diazaindacene derivative is used as the dopant material, but only green light emission is obtained. In such cases it is not possible to obtain red light emission and they do not constitute the luminescent materials which are the objective of the present invention. What characterizes the present invention is the discovery that by combination of a compound with a pyrromethene structure, or metal complex thereof, as the dopant material, and a host material with a fluorescence maximum of at least 540 nm, there is obtained red light emission of exceedingly high colour purity.

The host material should be a material with a fluorescence maximum of 540 nm or above, and there can be used an anthracene, pyrene, perylene or other such fused ring compound, a pyrazine, naphthylidene, quinoxaline, pyrrolopyridine, pyrimidine, thiophene, thioxanthene or other such heterocyclic ring compound, tris(8-quinolinolato) aluminium complex or other such quinolinol metal complex, a bipyridine metal complex, a rhodamine metal complex, an azomethine metal complex, a distyrylbenzene derivative, a tetraphenylbutadiene derivative, a stilbene derivative, an aldazine derivative, a coumarin derivative, a phthalimide derivative, a naphthalimide derivative, a perynone derivative, a pyrrolopyrrole derivative, a cyclopentadiene derivative, an imidazole derivative, oxazole derivative, thiazole derivative, oxadiazole derivative, thiadiazole derivative, triazole derivative or other such azole derivative or metal complex thereof, a merocyanine derivative, a porphyrin derivative, or a polyphenylenevinylene derivative, poly-p-phenylene derivative, polythiophene derivative or other such polymers. The compounds which are well known hitherto as the host material of a light-emitter mostly have a fluorescence maximum of below 540 nm, so it is necessary to obtain compounds having a fluorescence maximum of 540 nm or above by modification of their structure, etc. Now, in the case where the fluorescence maximum of the fundamental structure is already 540 nm or above, while there is no absolute necessity to perform such modification, it is preferred in order to carry out the energy transfer with the dopant material efficiently that the fluorescence maximum of the host material be optimized in terms of the dopant material by modification. Where it is desired to shift the fluorescence maximum of the host material to a longer wavelength, at least one aromatic ring or heterocyclic ring may be introduced into the fundamental structure as a substituent, or produced by ring fusion, or a cyclic structure contained in the fundamental structure of the fluorescent compound is replaced by a heterocycle. The case where at least one aromatic ring or heterocyclic ring is introduced into the fundamental structure as a substituent, or produced by ring fusion, also includes the introduction of the fundamental structure itself as a substituent or the production thereof by ring fusion.

Specifically, the following examples may be given. In the case of the fused ring anthracene derivatives, there are the bis(cyanostyryl)anthracene derivatives and the like, where aromatic rings have been introduced in conjugated fashion and electron-withdrawing cyano groups also introduced; in the case of the pyrene derivatives, there are the carbazolylvinylpyrene derivatives and the like, where a heterocyclic ring has been introduced in conjugated fashion; and in the case of the perylene derivatives, there are decacyclene derivatives with fused aromatic rings and the perylene dicarboxylic acid ester derivatives where electron-withdrawing carboxylic acid ester groups have been introduced. In the case of the heterocyclic pyrazine derivatives, there are the bisnaphthylvinylpyrazine derivatives, tristyrylpyrazine derivatives, tetrapyridylvinylpyrazine derivatives and the like where heterocyclic or aromatic rings have been introduced in a conjugated fashion; in the case of the naphthylidene derivatives, there are the pentaphenylnaphthylidene derivatives where aromatic rings have been introduced; in the case of the quinoxaline derivatives, there are the pyridoimidazoquinoxaline derivatives with condensed heterocyclic rings, bistriphenylaminovinylquinoxaline derivatives in which aromatic rings have been introduced, bispyrenylvinylquinoxaline derivatives in which aromatic rings have been introduced in conjugated fashion, and bis(phenylquinoxalyl)biphenyl derivatives in which the quinoxaline is itself linked together in conjugated fashion; in the case of the pyrimidine derivatives, there are pyrimidopyrimidine and the like where the pyrimidine is itself linked together in conjugated fashion; in the case of the thiophene derivatives, there are the bisstyrylthiophene derivatives and the like where aromatic rings have been introduced in conjugated fashion, and thienyl derivatives and the like where the thiophene is itself linked together in conjugated fashion. In the case of the quinolinol metal complexes, there are the tris(5,7-bis(4-phenyl)-8-quinolinolato)aluminium complex, bis(5,7-bis(4-phenyl)-8-quinolinolato)zinc complex, tris(5,7-bis(4-fluorophenyl)-8-quinolinolato) aluminium complex and bis(2-phenyl-8-quinolinolato)zinc complex where aromatic rings have been introduced, the bis(2-(bithienylvinyl)-8-quinolinolato)zinc complex, bis(2-(thienylvinyl)-8-quinolinolato)zinc complex, bis(2-(pyridylvinyl)-8-quinolinolato)zinc complex, bis(2-phenyl-8-quinolinolato)zinc complex and bis(2-styryl-8-quinolinolato)zinc complex where heterocyclic or aromatic rings are introduced in conjugated fashion, the benzo(f) quinolinol zinc complex with a condensed aromatic ring, acridine metal complexes, and the tris(2-cyano-8-quinolinolato)aluminium complex and 2-cyano-8-quinolinolato lithium complex and the like where the electron-withdrawing cyano group has been introduced. In the case of the bipyridyl metal complexes, there are the biphenylphenanthroline metal complexes and the like where there is a fused aromatic ring and aromatic rings have also been introduced. In the case of the distyrylbenzene derivatives, there are the distyrylpyrazine derivatives where the benzene structure has been replaced by the pyrazine structure. In the case of the stilbene derivatives, there are the bistriazinylstilbene derivatives and the like where heterocyclic rings have been introduced. In the case of the aldazine derivatives, there are the bisnaphthylaldazine derivatives and the like where an aromatic ring has been introduced. In the case of the coumarin derivatives, there are the dibenzotriazolylcoumarin derivatives and phenyloxadiazolylcoumarin derivatives where a heterocyclic ring has been introduced. In the case of the naphthalimide derivatives, there are the tetraphenylcarboxylic acid dianilide derivatives and tetraphenylcarboxylic acid diimide derivatives where the naphthalimide is itself linked in a condensed fashion, and the benzimidazolylbenzimidazopyrizonaphthalimide derivatives and the like where heterocyclic rings are condensed and introduced. In the case of the perynone derivatives, there are the dibenzoperynone derivatives with fused aromatic rings and the bisperynone derivatives and the like where the perynone is itself linked in a conjugated fashion. In the case of the pyrrolopyrrole derivatives, there are the diphenylpyrrolopyrrole derivatives and the like in which aromatic rings have been introduced. In the case of the cyclopentadiene derivatives, there are the bis(bithiophenyl) diphenylsilacyclopentadiene derivatives, bis(benzothiophenylthiophenyl)tetraphenylsilacyclopentadiene derivatives and the like where the cyclopentadiene structure is replaced by silacyclopentadiene and aromatic or heterocyclic rings are also introduced. In the case of the oxazole derivatives, there are the bis(benzoxazolyl)ethylene derivatives and the like with fused aromatic rings and also where the oxazole is itself linked in a conjugated fashion. In the case of the thiazole derivatives, there are the phenylazobenzothiazole derivatives and the like, with fused aromatic rings and where aromatic rings have also been introduced in a conjugated fashion. In the case of the oxadiazole derivatives, there are the bis(anthracenyloxadiazolyl)benzene derivatives, tris(anthracenyloxadiazolyl)benzene derivatives and the like, where aromatic rings have been introduced and where the oxadiazole is itself linked in a conjugated fashion. In the case of the thiadiazole derivatives, there are the bis(diphenylpyridinothiadiazolyl)benzene derivatives and the like, with condensed heterocyclic rings and where aromatic rings have been introduced and also where the thiadiazole is itself linked in a conjugated fashion. In the case of the merocyanine derivatives, there are the dicyanomethylenepyran derivatives and the like where electron-withdrawing cyano groups have been introduced. The above have been given as specific examples but the present invention is not restricted thereto.

As examples of ideal dopant materials, there can be cited the following compounds with a pyrromethene structure.

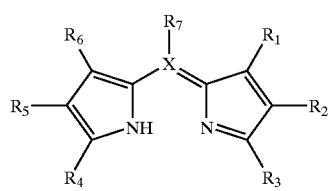

(Here, $R_1$ to $R_7$ may be the same or different, and are selected from hydrogen, alkyl group, alkoxy group, halogen group, aryl group, aralkyl group, alkenyl group, arylether group, heterocycle group, cyano group, aldehyde group, carbonyl group, ester group, carbamoyl group, amino group, and fused rings and aliphatic rings formed with an adjacent substituent. X is carbon or nitrogen, but in the case where it is nitrogen, no $R_7$ is present.)

Amongst these substituents, alkyl group denotes a saturated aliphatic hydrocarbon group such as, for example, the methyl group, ethyl group, propyl group or butyl group, and this may be unsubstituted or substituted. Alkoxy group denotes an aliphatic hydrocarbon group with an ether linkage interposed such as, for example, the methoxy group, and the aliphatic hydrocarbon moiety may be unsubstituted or substituted.

Halogen denotes fluorine, chlorine, bromine or iodine. Aryl group denotes an aromatic hydrocarbon group such as, for example, the phenyl group, naphthyl group, biphenyl group, phenanthryl group, terphenyl group or pyrenyl group, and this may be unsubstituted or substituted. Aralkyl group denotes an aromatic hydrocarbon group with an aliphatic hydrocarbon interposed such as, for example, the benzyl group or phenylethyl group, and the aliphatic hydrocarbon and/or the aromatic hydrocarbon may be unsubstituted or substituted. Alkenyl group denotes an unsaturated aliphatic hydrocarbon group containing a double bond such as, for example, the vinyl group, allyl group or butadienyl group, and this may be unsubstituted or substituted. Arylether group denotes an aromatic hydrocarbon group with an interposed ether linkage such as, for example, the phenoxy group, and the aromatic hydrocarbon moiety may be unsubstituted or substituted. Heterocyclic group denotes a group of cyclic structure in which there is an atom other than carbon such as, for example, the thienyl group, furyl group, pyrrolyl group, imidazolyl group, pyrazolyl group, oxazolyl group, pyridyl group, pyrazyl group, pyrimidyl group, quinolinyl group, isoquinolyl group, quinoxalyl group, acridinyl group or carbazolyl group, and this may be unsubstituted or substituted. The aldehyde group, carbonyl group, ester group, carbamoyl group and amino group include such groups which have been substituted with an aliphatic hydrocarbon, alicyclic hydrocarbon, aromatic hydrocarbon, heterocycle or the like, and the aliphatic hydrocarbon, alicyclic hydrocarbon, aromatic hydrocarbon or heterocycle may be unsubstituted or substituted. A fused ring and aliphatic ring formed with an adjacent substituent refers to the formation of a conjugated and unconjugated ring respectively formed at positions $R_1$ and $R_2$, $R_2$ and $R_3$, $R_4$ and $R_5$, or $R_5$ and $R_6$. Now, these condensed rings may include a nitrogen, oxygen or sulphur atom within the cyclic structure, and they may also be condensed with other rings.

Again, when co-ordinated to a metal, either only the compound with the pyrromethene structure may be co-ordinated or there may be mixed ligands, and there are no particular restrictions thereon. As a second ligand in the case of mixed ligands, there can be introduced an alkoxy group, phenoxy group, halogen group, alkyl group, aryl group or other fused ring hydrocarbon, heterocyclic compound, or aromatic ring or heterocyclic compound bonded via an oxygen atom, or the like.

The metal which can be co-ordinated to the aforesaid ligands is not particularly restricted but, as examples of the elements normally used, there are boron, beryllium, magnesium, chromium, iron, cobalt, nickel, copper, zinc, platinum and the like.

In order to obtain red light emission having outstanding colour purity characteristics, the compounds represented by the following general formula (2) are preferred from amongst the aforesaid compounds with a pyrromethene structure.

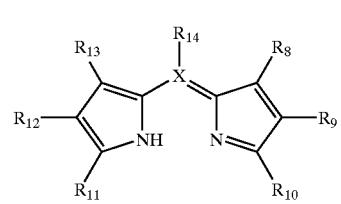

(Here, at least one of $R_8$ to $R_{14}$ either includes an aromatic ring or forms a fused aromatic ring with an adjacent substituent, while the rest are selected from hydrogen, alkyl group, alkoxy group, halogen group, aryl group, aralkyl group, alkenyl group, arylether group, heterocycle group, cyano group, aldehyde group, carbonyl group, ester group, carbamoyl group, amino group, and fused rings and aliphatic rings formed with an adjacent substituent. X is carbon or nitrogen, but in the case where it is nitrogen, no $R_{14}$ is present.)

The aromatic ring group referred to here is not restricted to an aromatic hydrocarbon group such as a phenyl group, naphthyl group or anthranyl group, but also includes heterocyclic aromatic functional groups such as the pyridyl group, quinolyl group or thienyl group. Again, a fused aromatic ring formed with an adjacent substituent refers to the formation of a fused aromatic ring at positions $R_8$ and $R_9$, $R_9$ and $R_{10}$, $R_{11}$ and $R_{12}$, or $R_{12}$ and $R_{13}$. Furthermore, these fused aromatic rings, in the same way as the above aromatic ring groups, may also include a nitrogen, oxygen or sulphur atom within the ring structure, and they may also be fused with other aromatic rings or aliphatic rings.

Moreover, in the case where the compound with a pyrromethene structure is used for a red light emitting material, in order to obtain high luminance characteristics it is further preferred that it be a compound of high fluorescence quantum yield. Hence, the compounds represented by the following general formula (3) are further preferred as the aforesaid compound with a pyrromethene structure.

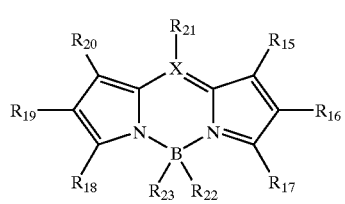

(Here, at least one of $R_{15}$ to $R_{21}$ either includes an aromatic ring or forms a fused aromatic ring with an adjacent substituent, while the rest are selected from hydrogen, alkyl group, alkoxy group, halogen group, aryl group, aralkyl group, alkenyl group, arylether group, heterocycle group, cyano group, aldehyde group, carbonyl group, ester group, carbamoyl group, amino group, and fused rings and aliphatic rings formed with an adjacent substituent. $R_{22}$ and $R_{23}$ may be the same or different and are selected from halogen group, hydrogen, alkyl group, aryl group and heterocyclic groups. X is carbon or nitrogen, but in the case where it is nitrogen, no $R_{21}$ is present.)

The following structures are provided as specific examples of the aforesaid compounds with a pyrromethene structure.

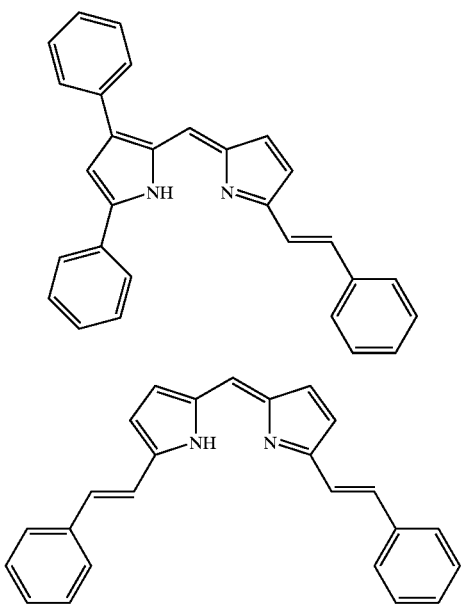

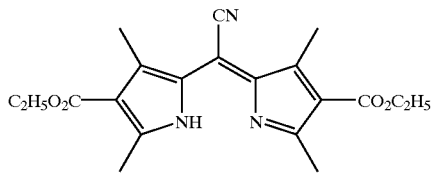

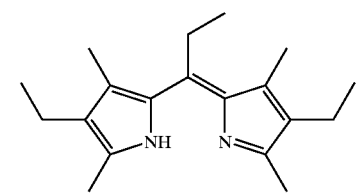

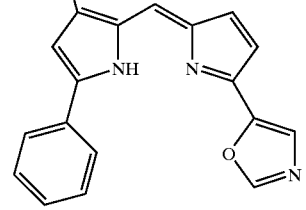

-continued

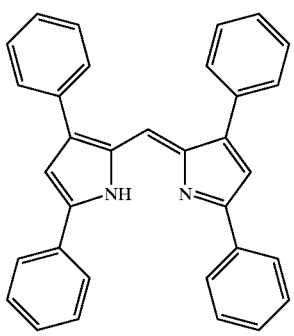

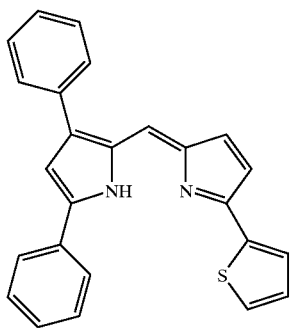

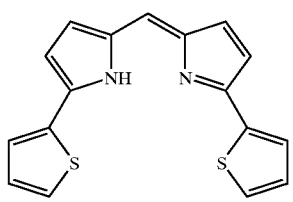

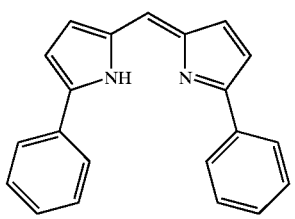

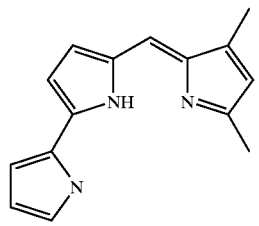

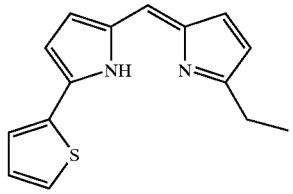

-continued
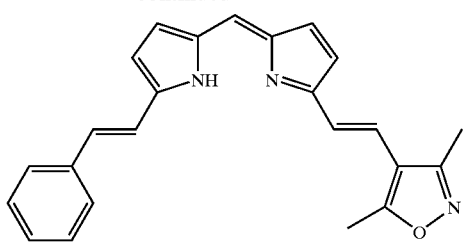
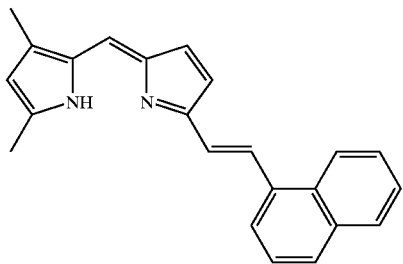
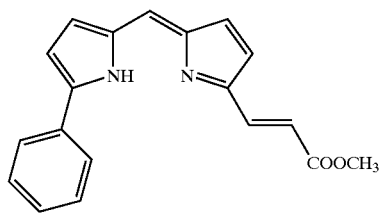
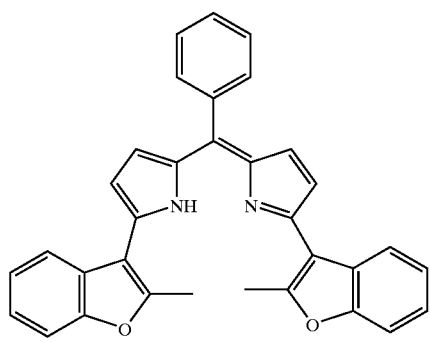
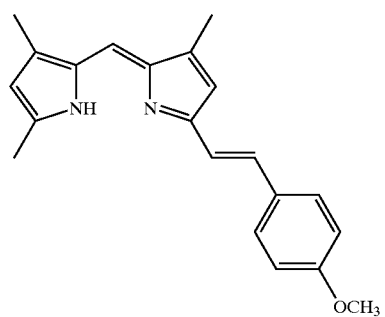
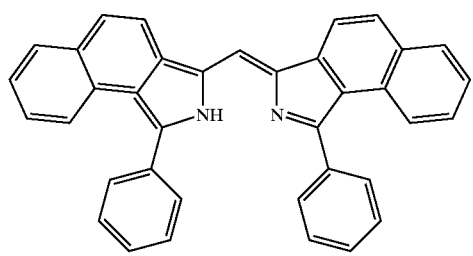
-continued
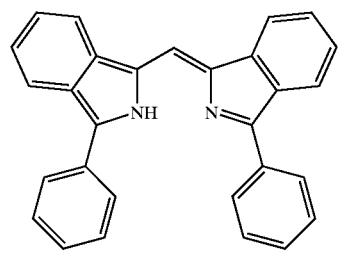
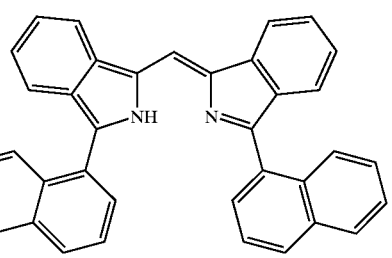
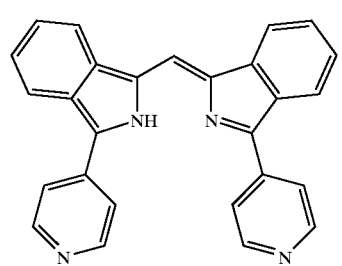
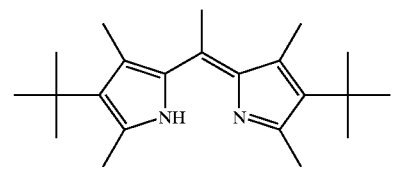
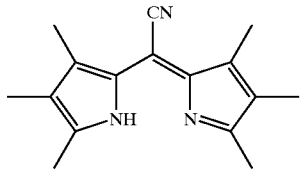
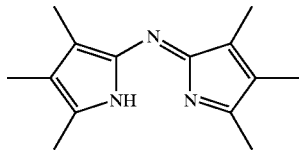
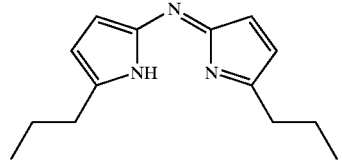
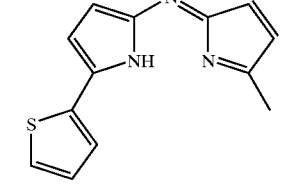

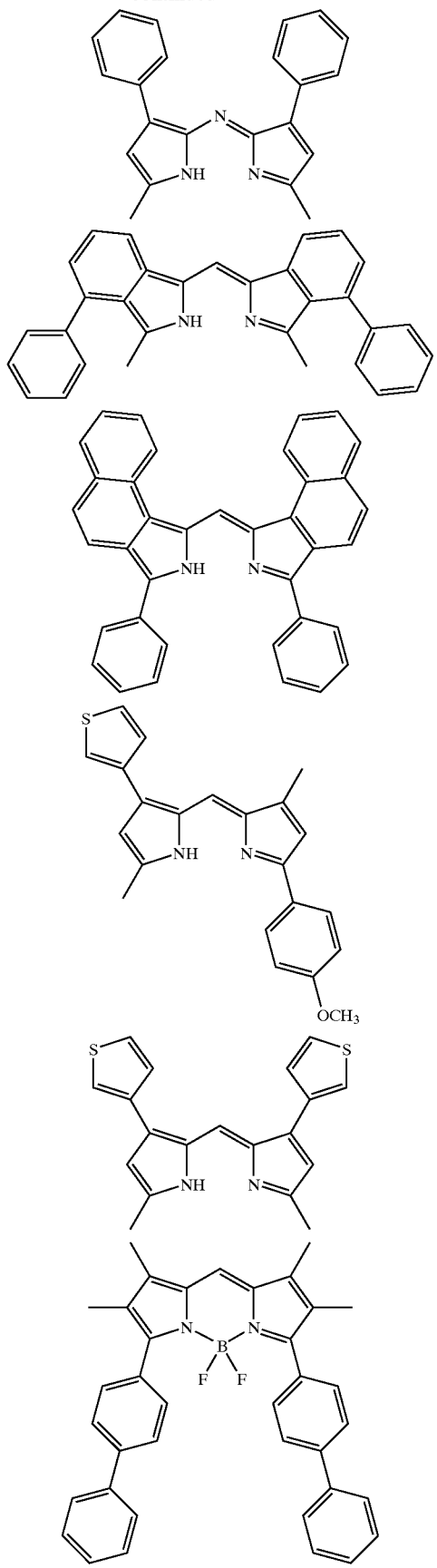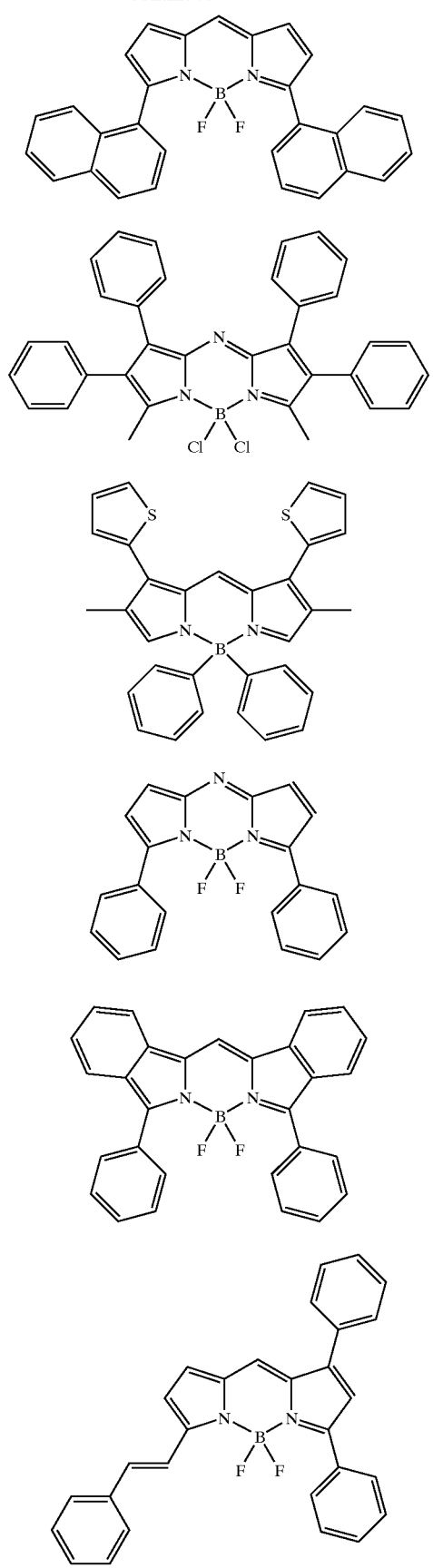

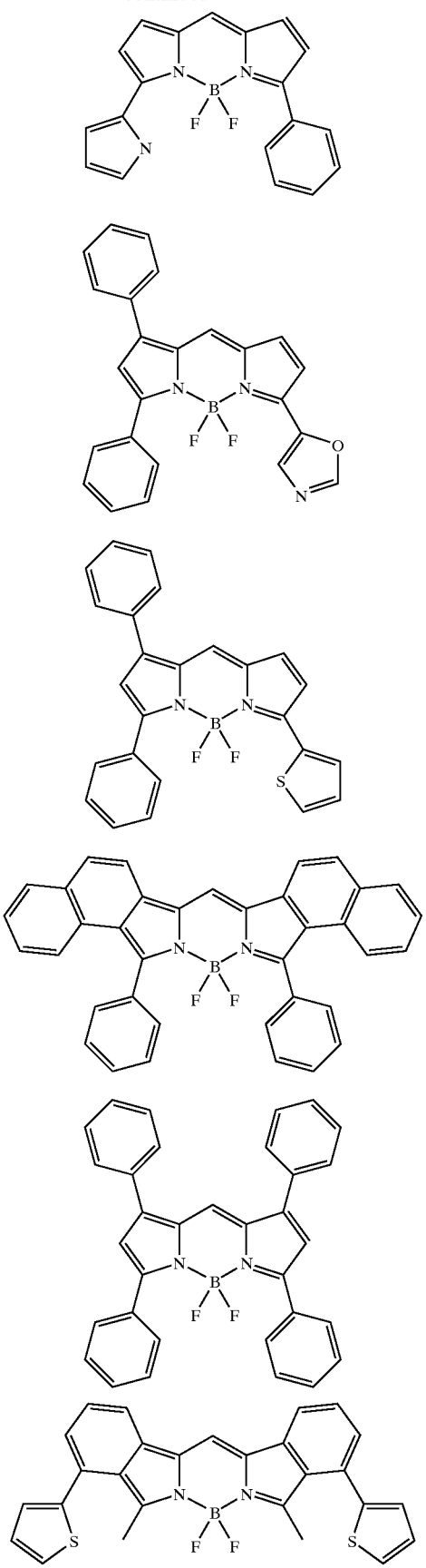
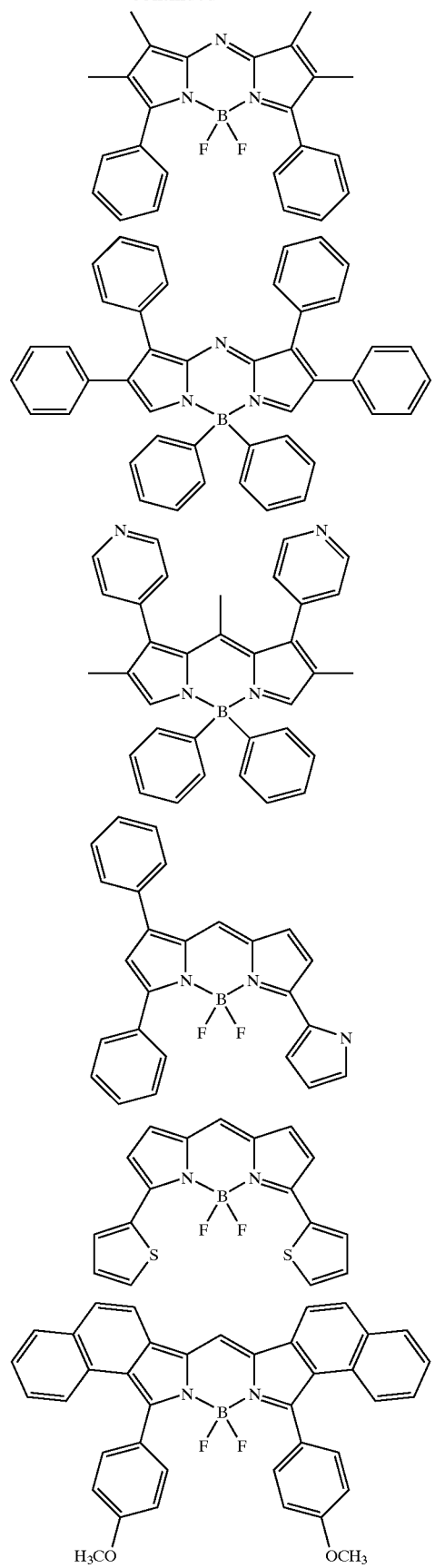

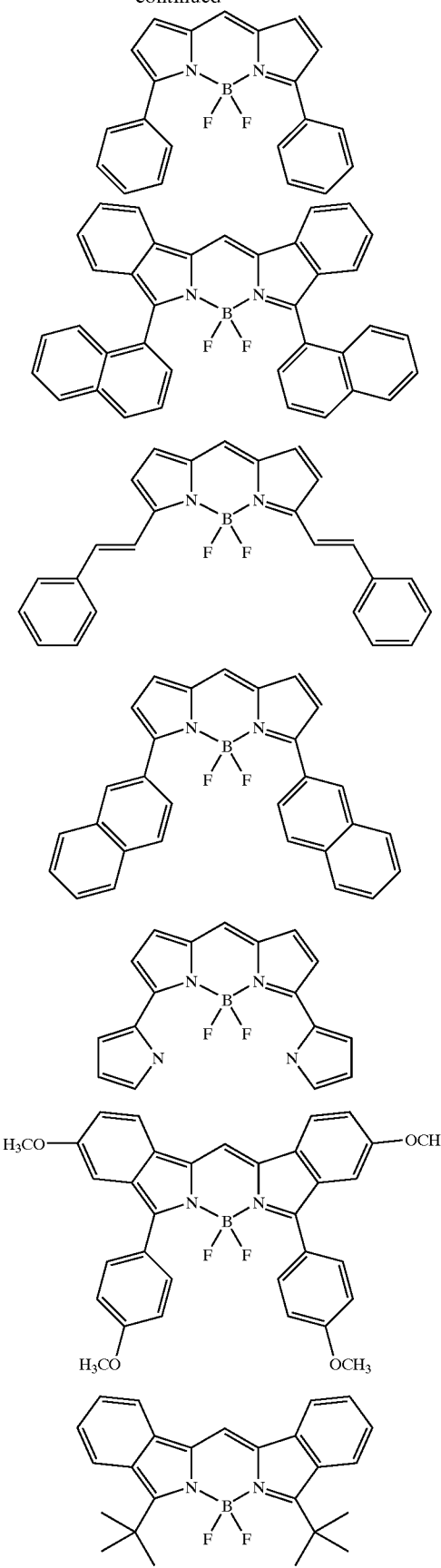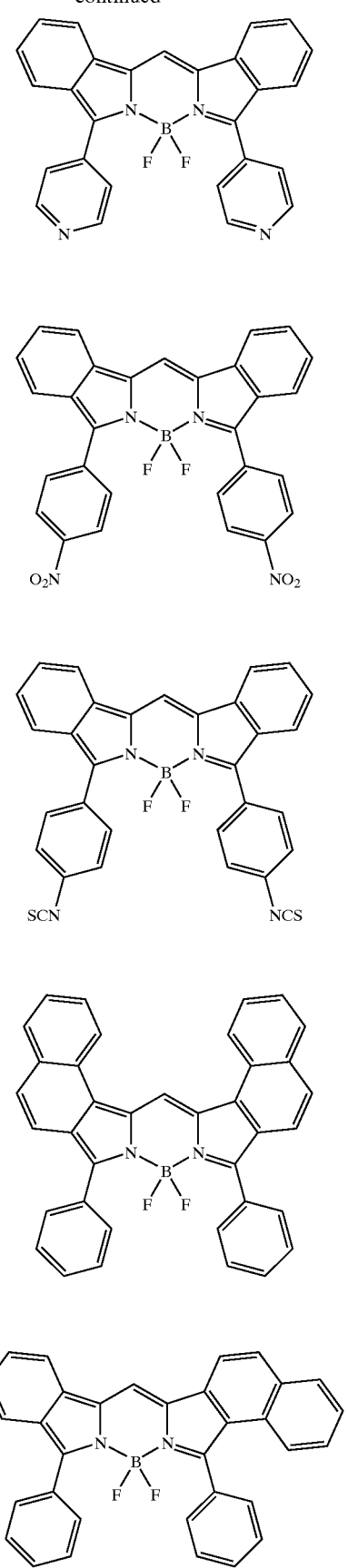

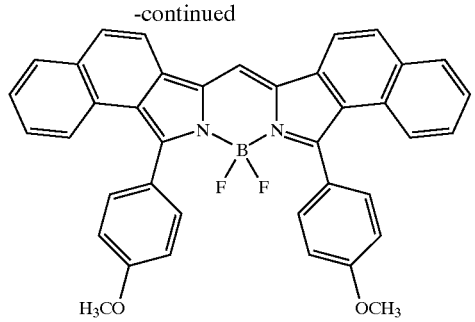

If the amount of dopant material added is too great, then the concentration quenching phenomenon occurs, so it is preferred that there be no more than 10 wt % in the luminescent layer, and more preferably no more than 2%. With regard to the doping method, fabrication can be carried out by a joint deposition method along with the host material, but the dopant material can also be mixed together beforehand with the host material and then deposited at the same time. Again, since the aforesaid compound with a pyrromethene structure emits light even using very small quantities, it is also possible to use a minute amount of the dopant material sandwiched in host material. In such circumstances, lamination may also be performed with one layer or with two or more layers of the host material.

Again, the dopant material added to the luminescent material need not necessarily be restricted to one aforesaid compound with a pyrromethene structure, and a number of the aforesaid compounds can be used mixed together or there may be used one or more previously-known dopant material mixed with the aforesaid compound or compounds. Specifically, the compound can be used jointly with conventionally-known naphthalimide derivatives, such as bis(diisopropylphenyl)perylene tetracarboxylic acid imide, perynone derivatives, rare earth complexes such as Eu complexes with ligands such as acetylacetone or benzoylacetone and phenanthroline, 4-(dicyanomethylene)-2-methyl-6-(p-dimethylaminostyryl)-4H-pyrane or analogues thereof, metal phthalocyanine derivatives such as magnesium phthalocyanine or aluminium chlorophthalocyanine, rhodamine derivatives, deazaflavin derivatives, coumarin derivatives, oxazine derivatives or the like.

With regard to the electron transporting material in the present invention, it is important that the electrons from the negative electrode of the electrodes to which the electric field has been applied be transported efficiently, and it is desirable that the electron injection efficiency be high and that the injected electrons are efficiently transported. Hence, a substance is desired which has high electron affinity, high electron mobility, excellent stability and which does not readily generate trap-forming impurities at the time of production or at the time of use. Substances which meet these conditions are quinolinol derivative metal complexes typified by 8-hydroxyquinoline aluminium, tropolone metal complexes, flavonol metal complexes, perylene derivatives, perynone derivatives, naphthalene, coumarin derivatives, oxadiazole derivatives, aldazine derivatives, bisstyryl derivatives, pyrazine derivatives, phenanthroline derivatives and the like. These electron transporting materials may be used on their own, but they may also be used in the form of a laminate or mixture of different electron transporting materials.

The materials used in the aforesaid hole transporting layer, luminescent layer and electron transporting layer can form the respective layers on their own but they can also be used dispersed in a polymeric binder such as polyvinyl chloride, polycarbonate, polystyrene, poly(N-vinylcarbazole), polymethyl methacrylate, polybutyl methacrylate, polyester, polysulphone, polyphenylene oxide, polybutadiene, hydrocarbon resin, ketone resin, phenoxy resin, polysulphone, polyamide, ethyl cellulose, vinyl acetate, ABS resin, polyurethane resin or other such solvent-soluble resin, phenolic resin, xylene resin, petroleum resin, urea resin, melamine resin, unsaturated polyester resin, alkyd resin, epoxy resin, silicone resin or other such crosslinking resin.

The method of forming the substance which brings about luminescence may be by deposition by resistance heating, electron beam deposition, sputtering, the molecular lamination method, a coating method or the like, and is not particularly restricted. However, normally, from the point of view of the properties, deposition by resistance heating or electron beam deposition are preferred. The thickness of the layer will depend on the resistance of the substance exhibiting luminescence, but between 1 and 1000 nm is preferred.

The matrix in the present invention refers to the grid-like arrangement of pixels for producing the display and, by assembly of the pixels, characters or images are displayed. The shape and size of the pixels are determined by the application. For example, in the case of personal computers, monitors, television images and character displays, there are normally employed square-shaped pixels of sides up to 300 $\mu$m, while in the case of large-size displays like a display panel there are used pixels having sides of the mm order. In the case of a monochromatic display, there may be arranged pixels of the same colour but, in the case of a colour display, display is effected by arrangement of red, green and blue pixels. In this arrangement, typically there are delta types and stripe types. With regard to the matrix driving method, there may be employed either a line-at-a-time driving method or an active matrix. Line-at-a-time driving, has the advantage of having a simpler construction but, when the performance characteristics are taken into account, the active matrix may sometimes be superior. This too needs to be determined by the application.

A segment system in the present invention is a system whereby patterns are formed for displaying previously determined information and display is effected by causing light emission in these specified regions. Examples are the time or temperature display in a digital clock or thermometer, the operating state display of audio equipment or microwave oven, etc, or a motor vehicle panel display, etc. Furthermore, the aforesaid matrix display and segment display may both be present in the same panel.

A back light in the present invention is primarily used with the objective of enhancing the visibility of a display device which is not self light-emitting, and it is employed in liquid crystal display devices, clocks, audio equipment, motor vehicle panels, display boards, markers and the like. In particular, in the case of the back light for liquid crystal devices and especially personal computer applications where reducing the thickness has been a problem, taking into account the fact that conventional systems have comprised fluorescent lamps or light-guiding sheets so that producing thin such devices has been difficult, the back light in the present invention is characterized by being both thin and lightweight.

Below, the present invention is explained by providing examples and comparative examples but the invention is not to be restricted by these examples.

EXAMPLE 1

A glass substrate on which a 150 nm ITO transparent conducting film had been deposited (produced by the Asahi Glass Co., 15 Ω/, electron beam deposited product) was cut to size 30×40 mm, and etching carried out. The substrate obtained was subjected to 15 minutes ultrasonic washing using acetone and using Semico-Clean 56 respectively, after which washing was carried out with ultra-pure water. Next, 15 minutes ultrasonic washing was carried out using isopropyl alcohol, after which the substrate was immersed for 15 minutes in hot methanol and then dried. This substrate was subjected to a 1 hour UV-ozone treatment just prior to the construction of the element, then placed in a vacuum vapour deposition device and evacuation performed until the degree of vacuum inside the device was no more than $1 \times 10^{-5}$ Pa. Using the resistance heating method, first of all there was deposited 100 nm of N,N'-diphenyl-N,N'-(3-methylphenyl)-1,1'-diphenyl-4,4'-diamine (TPD) as the hole transporting material. Next, using tris(5,7-bis(4-fluorophenyl)-8-quinolinolato)aluminium complex (fluorescence maximum of the powder 559 nm, fluorescence maximum in DMF solution 552 nm) as the host material, and using 4,4-difluoro-1,3,5,7-tetraphenyl-4-bora-3a,4a-diaza-s-indacene (fluorescence maximum in dichloromethane solution 611 nm) as the dopant material, co-deposition was performed to a thickness of 50 nm such that dopant material comprised 1 wt %, and then a 50 nm layer of host material provided. Next, 0.2 nm of lithium and 150 nm of silver were deposited to produce the cathode and a 5 mm×5 mm square element constructed. The peak emission wavelength of this electroluminescent element was 609 nm and a beautiful red luminescence was shown of spectrum FWHM 52 nm.

EXAMPLE 2

A glass substrate on which a 150 nm ITO transparent conducting film had been deposited (produced by the Asahi Glass Co., 15 Ω/, electron beam deposited product) was cut to size 30×40 mm, and etching carried out. The substrate obtained was subjected to 15 minutes ultrasonic washing using acetone and using Semico-Clean 56 respectively, after which washing was carried out with ultra-pure water. Next, 15 minutes ultrasonic washing was carried out using isopropyl alcohol, after which the substrate was immersed for 15 minutes in hot methanol and then dried. This substrate was subjected to a 1 hour UV-ozone treatment just prior to the construction of the element, then placed in a vacuum vapour deposition device and evacuation performed until the degree of vacuum inside the device was no more than $5 \times 10^{-5}$ Pa. Using the resistance heating method, first of all there was deposited 100 nm of TPD as the hole transporting material. Next, using bis(2-(bithienylvinyl)-8-quinolinolato) zinc complex (fluorescence maximum of the powder 591 nm, fluorescence maximum in DMF solution 589 nm) as the host material, and using difluoro[3-phenyl-1-[(3-phenyl-2H-benzo[c]isoindol-1-yl)methylene]-1H-benzo[c]isoindolato-$N^1,N^2$]boron (fluorescence maximum in dichloromethane solution 645 nm) as the dopant material, co-deposition was performed to a thickness of 50 nm such that dopant material comprised 1 wt %, and then a 50 nm layer of host material was provided. Next, 0.5 nm of lithium and 200 nm of aluminium were deposited to produce the cathode and a 5×5 mm square element constructed. The peak emission wavelength of this electroluminescent element was 646 nm and a beautiful red luminescence was shown of spectrum FWHM 40 nm.

Comparative Example 1

An electroluminescent element was constructed in the same way as in Example 1 except that there was used tris(8-quinolinolato)aluminium complex (fluorescence maximum 513 nm) as the host material. The fluorescence maximum of the electroluminescent element was 520 nm.

Practically no energy transfer to the dopant material was observed and a green luminescence was shown from the host material. It was not possible to obtain red luminescence from the dopant material.

EXAMPLE 3

An electroluminescent element was constructed in the same way as in Example 1 except that there was used the following perynone derivative (fluorescence maximum 580 nm) as the host material. The peak emission wavelength of this electroluminescent element was 610 nm and a beautiful red luminescence was shown of spectrum FWHM 50 nm.

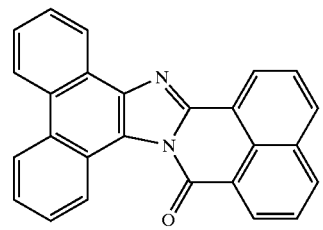

EXAMPLE 4

An electroluminescent element was constructed in the same way as in Example 2 except that there was used the following perynone derivative (fluorescence maximum 600 nm) as the host material. The peak emission wavelength of this electroluminescent element was 645 nm and a beautiful red luminescence was shown of spectrum FWHM 40 nm.

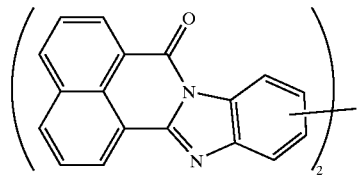

EXAMPLE 5

An electroluminescent element was constructed in the same way as in Example 2 except that there was used bis(2',6'-diisopropylanilido)perylene-3,4,9,10-tetracarboxylic acid (fluorescence maximum 620 nm) as the host material. The peak emission wavelength of this electroluminescent element was 645 nm and a beautiful red luminescence was shown of spectrum FWHM 40 nm.

EXAMPLE 6

An electroluminescent element was constructed in the same way as in Example 1 except that there was used N-(dimethylphenyl)-naphthalimide (fluorescence maximum 590 nm) as the host material. The peak emission wavelength of this electroluminescent element was 610 nm and a beautiful red luminescence was shown of spectrum FWHM 50 nm.

EXAMPLE 7

An electroluminescent element was constructed in the same way as in Example 1 except that there was used 3,6-diphenyl-2,5-dihydro-2,5-dimethylpyrrolo[3,4-c]pyrrole-1,4-dione (orange coloured fluorescence) as the host material, and 4,4-difluoro-5,7-diphenyl-3-(oxazol-5-yl)-4-bora-3a,4a-diaza-s-indacene (fluorescence maximum in dichloromethane solution 613 nm) as the dopant material. The peak emission wavelength of this electroluminescent element was 612 nm and a beautiful red luminescence was shown of spectrum FWHM 50 nm.

EXAMPLE 8

An electroluminescent element was constructed in the same way as in Example 1 except that there was used 3,8-dimethylpyrido[1',2':1,2]imidazo[4,5-b]quinoxaline (yellow colour fluorescence) as the host material. The peak emission wavelength of this electroluminescent element was 610 nm and a beautiful red luminescence was shown of spectrum FWHM 50 nm.

EXAMPLE 9

An electroluminescent element was constructed in the same way as in Example 1 except that there was used the following quinoxaline derivative (fluorescence maximum 575 nm) as the host material. The peak emission wavelength of this electroluminescent element was 610 nm and a beautiful red luminescence was shown of spectrum FWHM 50 nm.

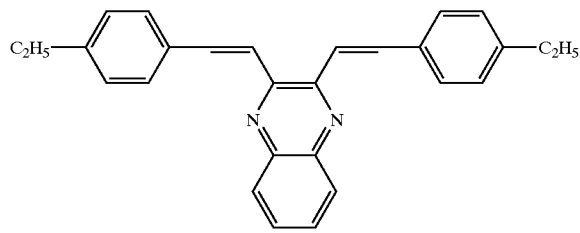

EXAMPLE 10

An electroluminescent element was constructed in the same way as in Example 2 except that there was used the following quinoxaline derivative (orange fluorescence) as the host material. The peak emission wavelength of this electroluminescent element was 640 nm and a beautiful red luminescence was shown of spectrum FWHM 50 nm.

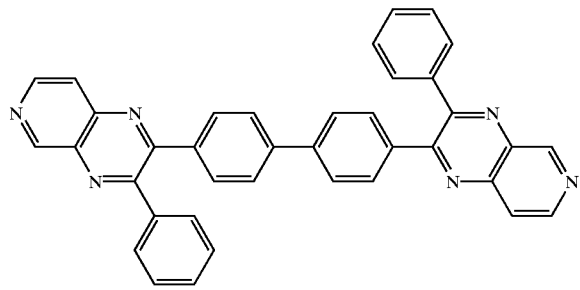

EXAMPLE 11

An electroluminescent element was constructed in the same way as in Example 7 except that there was used 2,3,5,6-tetrakis[2-(phenyl)vinyl]pyrazine (yellow fluorescence) as the host material. The peak emission wavelength of this electroluminescent element was 612 nm and a beautiful red luminescence was shown of spectrum FWHM 50 nm.

EXAMPLE 12

An electroluminescent element was constructed in the same way as in Example 1 except that there was used the following styrylthiophene derivative (fluorescence maximum 550 nm) as the host material. The peak emission wavelength of this electroluminescent element was 610 nm and a beautiful red luminescence was shown of spectrum FWHM 50 nm.

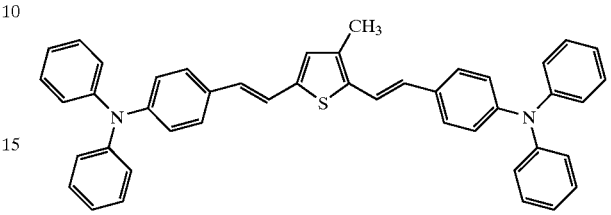

EXAMPLE 13

An electroluminescent element was constructed in the same way as in Example 1 except that there was used 5,5''-bis{4-[bis(4-methylphenyl)amino]phenyl}-2,2':5',2''-terthiophene (fluorescence maximum 570 nm) as the host material. The peak emission wavelength of this electroluminescent element was 610 nm and a beautiful red luminescence was shown of spectrum FWHM 50 nm.

EXAMPLE 14

An electroluminescent element was constructed in the same way as in Example 1 except that there was used 1,1-dimethyl-2,5-bis(5-t-butyldiphenylsilyl-2-thienyl)-3,4-diphenylsilacyclopentadiene (fluorescence maximum 551 nm) as the host material. The peak emission wavelength of this electroluminescent element was 610 nm and a beautiful red luminescence was shown of spectrum FWHM 50 nm.

EXAMPLE 15

A glass substrate on which a 150 nm ITO transparent conducting film had been deposited (produced by the Asahi Glass Co., 15 Ω/, electron beam deposited product) was cut to size 30×40 mm and, using photolithography, patterning was carried out to give a 300 μm pitch (remaining width 270 μm)×32 striped pattern. In order to facilitate electrical connection with the outside, the ITO stripes at one side in the lengthwise direction were broadened to a 1.27 mm pitch (width of apertures 800 μm). The substrate obtained was subjected to 15 minutes ultrasonic washing using acetone and using Semico-Clean 56 respectively, after which washing was carried out with ultra-pure water. Next, 15 minutes ultrasonic washing was carried out using isopropyl alcohol, after which the substrate was immersed for 15 minutes in hot methanol and then dried. This substrate was subjected to a 1 hour UV-ozone treatment just prior to the construction of the element, then placed in a vacuum vapour deposition device and evacuation performed until the degree of vacuum inside the device was no more than $5\times10^{-5}$ Pa. Using the resistance heating method, first of all there was deposited 100 nm of N,N'-diphenyl-N,N'-(3-methylphenyl)-1,1'-diphenyl-4,4'-diamine (TPD). Next, using tris(5,7-bis(4-fluorophenyl)-8-quinolinolato)aluminium complex as the host material, and using 4,4-difluoro-1,3,5,7-tetraphenyl-4-bora-3a,4a-diaza-s-indacene as the dopant material, co-deposition was performed to a thickness of 50 nm such that dopant material comprised 1 wt %, and then a 50 nm layer of host material was provided. Subsequently, a mask provided with sixteen of stripe shaped apertures which are 250 μm in width (remaining width 50 μm, equivalent to a 300 μm pitch) in a 50 μm thick Nickel-Cobalt alloy sheet by wet-etching was fitted to the substrate, in a vacuum, so as to be perpendicular to the ITO stripes, and secured with a magnet from the undersurface so that the mask and the substrate were closely affixed. Furthermore, 50 nm of magnesium and 150 nm of aluminium were deposited to produce the cathode and a 32×15 dot matrix element constructed. When this element was subjected to matrix driving, character display was possible without cross-talk.

INDUSTRIAL APPLICATION POTENTIAL

The present invention can provide red electrofluorescent elements of high electrical energy utilization efficiency and outstanding colour purity.

The electrofluorescent elements of the present invention can be employed in fields such as display devices, flat panel displays, back lights, illumination, interiors, markers, signs, electronic cameras, optical signal generators and the like.

What is claimed is:

1. An electroluminescent element comprising a substance which brings about luminescence is disposed between an anode and a cathode, the electroluminescent element emits light at a peak wavelength of at least 580 nm by means of electrical energy, the substance which brings about luminescence comprises a fluorescent compound having a fluorescence maximum at 540 nm or above and a compound with a pyrromethene structure represented by the following general formula (1) or a metal complex thereof,

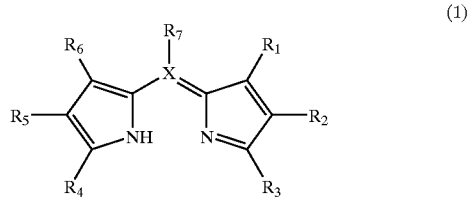

(1)

wherein at least one of $R_1$, $R_3$, $R_4$, or $R_6$ is selected from the group consisting of an alkenyl group, or an aryl group, or a heterocycle group, or forms a fused ring with an adjacent substituent, $R_7$ is selected from the group consisting of hydrogen, alkyl groups, alkoxy groups, at least one halogen atom, aralkyl groups, alkenyl groups, arylether groups, heterocycle groups, cyano groups, aldehyde groups, carbonyl groups, ester groups, carbamoyl groups, amino groups, and fused rings and aliphatic rings formed with an adjacent substituent, and the remaining substituents are selected from the group consisting of hydrogen, alkyl groups, alkoxy groups, at least one halogen atom, aryl groups, aralkyl groups, alkenyl groups, arylether groups, heterocycle groups, cyano groups, aldehyde groups, carbonyl groups, ester groups, carbamoyl groups, amino groups, and fused rings and aliphatic rings formed with an adjacent substituent, X is carbon or nitrogen, but when X is nitrogen, no $R_7$ is present, and when X is carbon, $R_7$ may not be a cyano group.

2. An electroluminescent element according to claim 1, wherein the electroluminescent element emits light at a peak wavelength between 580 nm and 720 nm by means of electrical energy, and the fluorescent compound is a fluorescent compound having a fluorescence maximum between 540 nm and 720 nm.

3. An electroluminescent element according to claim 1, wherein the metal of the metal complex is at least one metal selected from the group consisting of boron, beryllium, magnesium, chromium, iron, cobalt, nickel, copper, zinc and platinum.

4. An electroluminescent element according to claim 1, wherein the compound with the pyrromethene structure is represented by the following general formula (3),

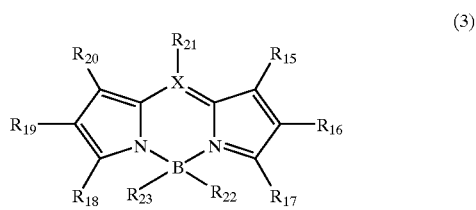

(3)

wherein at least one of $R_{15}$, $R_{17}$, $R_{18}$, or $R_{20}$ is selected from the group consisting of an alkenyl group, or an aryl group, or a heterocycle group, or forms a fused aromatic ring with an adjacent substituent, $R_{21}$ is selected from the group consisting of hydrogen, alkyl groups, alkoxy groups, at least one halogen atom, aralkyl groups, alkenyl groups, arylether groups, heterocycle groups, cyano groups, aldehyde groups, carbonyl groups, ester groups, carbamoyl groups, amino groups, and fused rings and aliphatic rings formed with an adjacent substituent, and the remaining substituents are selected from the group consisting of hydrogen, alkyl groups, alkoxy groups, at least one halogen atom, aryl groups, aralkyl groups, alkenyl groups, arylether groups, heterocycle groups, cyano groups, aldehyde groups, carbonyl groups, ester groups, carbamoyl groups, amino groups, and fused rings and aliphatic rings formed with an adjacent substituent, $R_{22}$ and $R_{23}$ may be the same or different and are selected from the group consisting of halogen groups, hydrogen, alkyl groups, aryl groups and heterocyclic groups, X is carbon or nitrogen, but when X is nitrogen, no $R_{21}$ is present, and when X is carbon, $R_{21}$ is not a cyano group.

5. An electroluminescent element according to claim 1, wherein the fluorescent compound includes a structure that is at least one group selected from the group consisting of anthracene derivatives, pyrene derivatives, perylene derivatives, pyrazine derivatives, naphthylidene derivatives, quinoxaline derivatives, pyrrolopyridine derivatives, pyrimidine derivatives, thiophene derivatives, thioxanthene heterocycle derivatives, quinolinol metal complexes, bipyridine metal complexes, rhodamine metal complexes, azomethine metal complexes, distyrylbenzene derivatives, tetraphenylbutadiene derivatives, stilbene derivatives, aldazine derivatives, coumarin derivatives, phthalimide derivatives, naphthalimide derivatives, perynone derivatives, pyrrolopyrrole derivatives, cyclopentadiene derivatives, imidazole derivatives or metal complexes thereof, oxazole derivatives or metal complexes thereof, thiazole derivatives or metal complexes thereof, oxadiazole derivatives or metal complexes thereof, thiadiazole derivatives or metal complexes thereof, triazole derivatives or metal complexes thereof, merocyanine derivatives, porphyrin derivatives, polyphenylenevinylene derivatives, poly-p-phenylene derivatives and polythiophene derivatives.

6. An electroluminescent element according to claim 1 wherein the substance which brings about luminescence comprises a luminescent material and a hole transporting material or an electron transporting material or combinations thereof.

7. An electroluminescent element according to claim 1 wherein the substance which brings about luminescence includes a least a luminescent layer.

8. An electroluminescent element according to claim 7 wherein the substance which brings about luminescence has a laminate structure including at least a hole transporting layer and a luminescent layer.

9. An electroluminescent element according to claim 7 or claim 8 wherein the compound with a pyrromethene structure or metal complex thereof is included in the luminescent layer in a range up to 10 wt %.

10. A plurality of electroluminescent elements according to claim 1 wherein the elements are used as a display in a matrix and/or segment system.

* * * * *